United States Patent
Desai et al.

(10) Patent No.: US 7,391,221 B2
(45) Date of Patent: Jun. 24, 2008

(54) ON-DIE IMPEDANCE CALIBRATION

(75) Inventors: Jayen J. Desai, Wellington, CO (US); James M. Dewey, Ft. Collins, CO (US); David Purvis, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 70 days.

(21) Appl. No.: 11/166,825

(22) Filed: Jun. 24, 2005

(65) Prior Publication Data

US 2007/0013395 A1  Jan. 18, 2007

(51) Int. Cl.
*G01R 35/00* (2006.01)

(52) U.S. Cl. .................. 324/601; 324/600; 327/378; 326/30

(58) Field of Classification Search ............. 324/761, 324/601, 600, 158.1; 326/30; 327/378
See application file for complete search history.

(56) References Cited

U.S. PATENT DOCUMENTS

| | | | |
|---|---|---|---|
| 6,535,047 B2 * | 3/2003 | Mughal et al. | 327/378 |
| 6,734,702 B1 * | 5/2004 | Ikeoku et al. | 326/30 |
| 7,061,266 B2 * | 6/2006 | Sagiv | 326/30 |
| 2002/0067168 A1 * | 6/2002 | Sessions | 324/601 |
| 2004/0165693 A1 * | 8/2004 | Lee et al. | 377/94 |
| 2005/0012533 A1 * | 1/2005 | Aoyama et al. | 327/170 |
| 2007/0040573 A1 * | 2/2007 | Batt | 326/30 |

* cited by examiner

*Primary Examiner*—Vincent Q. Nguyen
*Assistant Examiner*—Joshua Benitez
(74) *Attorney, Agent, or Firm*—Drinker Biddle & Reath, LLP

(57) ABSTRACT

One exemplary device has a plurality of leads with termination impedances, and a standard impedance. Among the termination impedances are master impedances arranged to be calibrated by comparison with the standard impedance and slave impedances arranged to be calibrated in accordance with an associated master impedance.

6 Claims, 4 Drawing Sheets

ON-DIE IMPEDANCE CALIBRATION

BACKGROUND

A transmission line may be terminated with an impedance that is matched to a characteristic impedance of the transmission line. However, if the termination impedance is in a variable environment, the impedance may vary undesirably. For example, in the case of the termination impedance on a processor die, the heat generated by the processor may affect the impedance. It has therefore been proposed to terminate transmission lines leading onto the die with controllably variable impedances, and to calibrate the on-die termination impedances by comparison with a standard impedance in a more stable environment.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Reference will now be made in detail to various embodiments of the present invention, examples of which are illustrated in the accompanying drawings.

Figure 1:
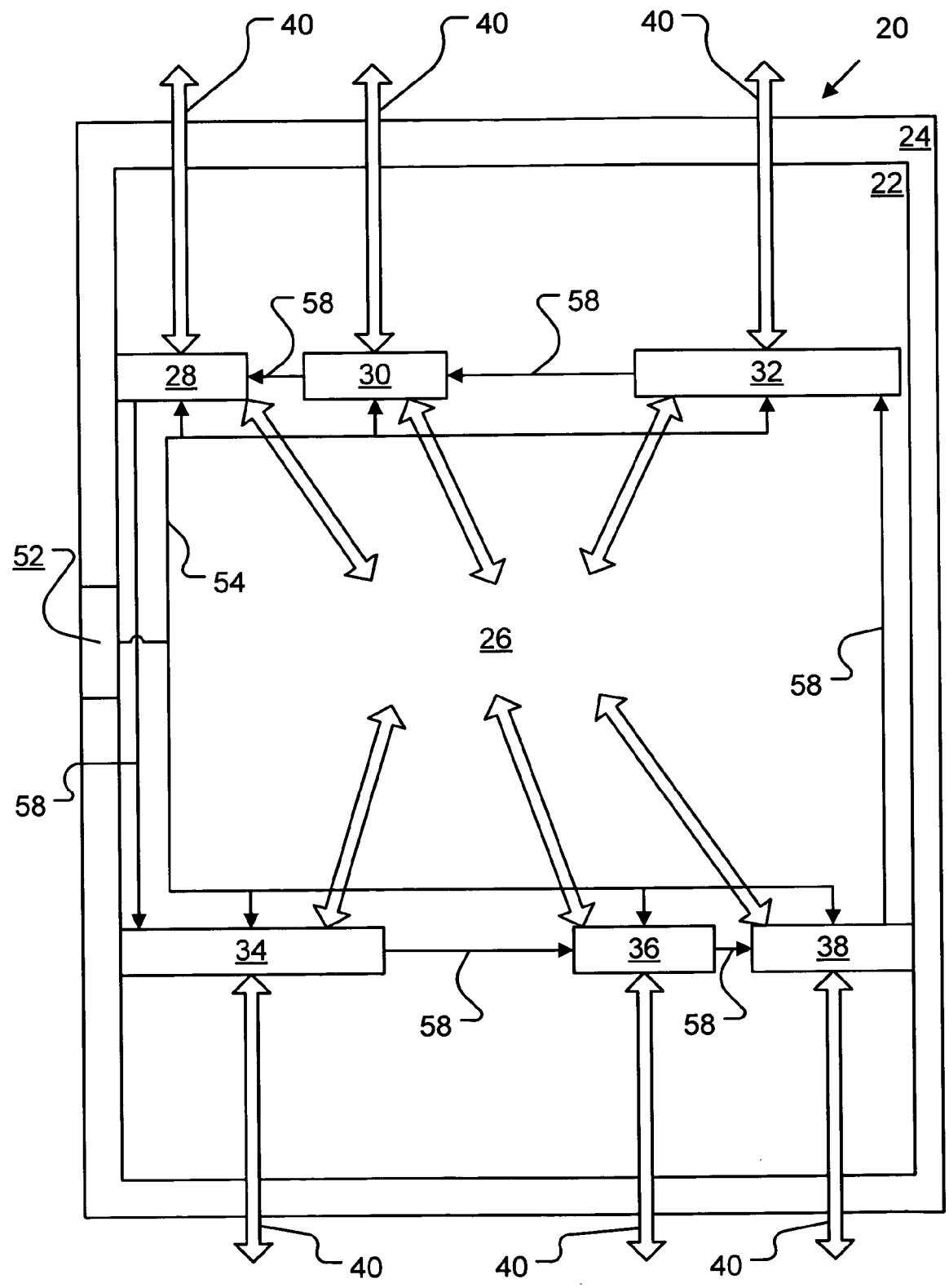
FIG. 1 is a schematic plan view of an embodiment of a die in accordance with an embodiment of the invention.

Referring initially to FIG. 1, one form of device indicated by the reference numeral 20 includes a semiconductor die 22 within a package 24. The die 22 supports functional components 26, for example, an arithmetic logic unit, a floating point unit, cache, or the like, and input/output (I/O) stripes 28, 30, 32, 34, 36, 38. Each I/O stripe 28, 30, 32, 34, 36, 38 is connected to a set of external signal lines indicated symbolically by arrows 40. In an embodiment, each set of signal lines 40 comprises a parallel signal line, with a physical signal lead 42 shown in FIG. 2 for each bit of the parallel data signal. In an embodiment, some of the sets of signal lines 40 may be data lines, and some may be control lines. With 64-bit parallel communication being increasingly common, each I/O stripe 28, 30, 32, 34, 36, 38 may terminate tens or hundreds of physical signal leads. In FIG. 1, the I/O stripes 28, 30, 32, 34, 36, 38 form compact units spaced apart around the die 22. The size, number, and position of the I/O units may be related to the arrangement of the functional components 26, for example, so that all the bits of a parallel signal line 40 are brought onto the die 22 close to a functional component that uses that line.

Figure 2:
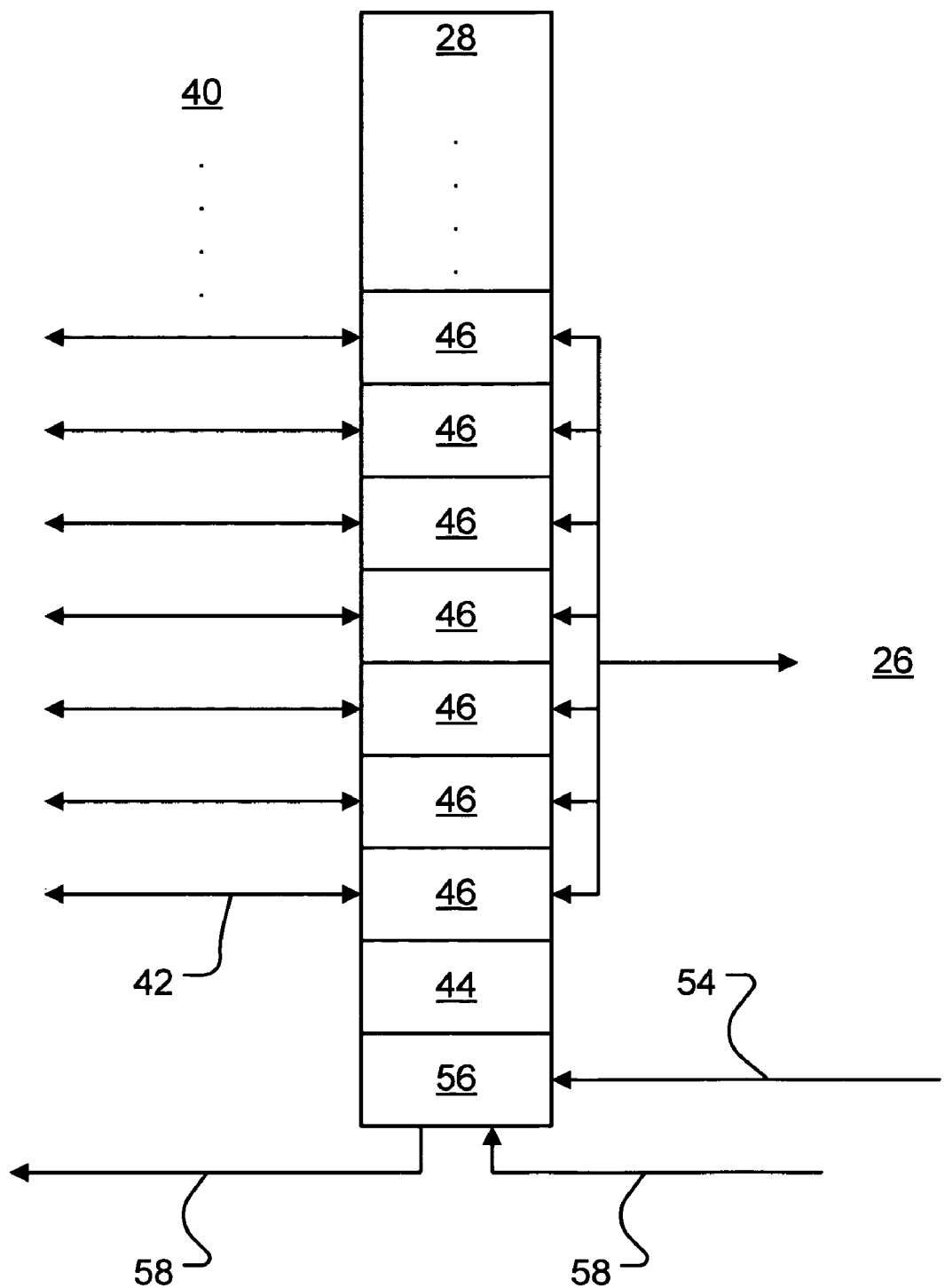
FIG. 2 is a diagram of a detail of the die shown in FIG. 1.

Referring now also to FIG. 2, each lead 42 terminates in an On Die Termination Resistor (ODTR) 46 which is matched to the characteristic impedance of the lead 42. FIG. 2 shows the I/O stripe 28 by way of example, but the other I/O stripes 30, 32, 34, 36, 38 may be similar. The ODTRs in the I/O stripe 28, and in each other I/O stripe 30, 32, 34, 36, 38, comprise one master ODTR 44, which does not terminate a signal lead 42, and several slave ODTRs 46. In one embodiment, as is described in U.S. Pat. No. 6,535,047 to Mughal et al., which is incorporated herein by reference in its entirety, each ODTR 44, 46 may comprise a row of equal resistors in parallel, each in series with a field effect transistor (FET). The master ODTR 44 may be calibrated, by switching FETs on or off, and thus controlling the number of the resistors in the circuit, until the equivalent resistance of the in-circuit resistors matches the resistance of a standard resistor 52 shown in FIG. 1. A calibration code representing the number of FETs switched on is then broadcast by the master ODTR 44 to the slave ODTRs 46.

In the device 20 shown in FIGS. 1 and 2, one ODTR 44 in each I/O stripe 28, 30, 32, 34, 36, 38 is a master ODTR 44, and the others are slave ODTRs 46 associated with the master ODTR 44 in the same I/O stripe. A single reference resistor or standard resistor 52 is mounted on the outside of the package 24, away from the die 22, and is connected to all of the I/O stripes 28, 30, 32, 34, 36, 38 by resistor leads 54. The reference resistor 52, being off the chip, may be constructed in a manner other than the chip-fabrication process technology used for the ODTR's 44, 46. The reference resistor 52 may be a high-precision resistor made with a true analog technology. Such an analog resistor may be guaranteed to be within 1 or 2% of its listed resistance value at all times. The reference resistor 52 may be located in a position where it is less exposed to environmental fluctuations, such as heating from the functional components 26, than the I/O stripes 28, 30, 32, 34, 36, 38.

In use of the device 20, the resistors (not shown) of the ODTRs 44, 46 vary because of environmental factors, such as heat produced by the functional components 26. By continually calibrating the ODTR's 44, 46 against the reference resistor 52, during use of the device 20, the resistance of the ODTR's 46 may be kept matched to the characteristic impedance of the signal leads 42, and signal transmission quality may be correspondingly maintained. Because each of the stripes 28, 30, 32, 34, 36, 38 is fairly compact, the environmental factors do not vary much over the stripe, and sharing a single calibration code over all the ODTRs 46 in the same stripe may give substantially better calibration than sharing a single calibration code over all the ODTRs 46 in the device 20.

Each I/O stripe 28, 30, 32, 34, 36, 38 also includes a calibration controller 56. The calibration controller 56 calibrates the ODTR 44 by comparing the ODTR with the standard resistor 52. The calibration controller 56 also controls the lead 54 between the standard resistor 52 and the master ODTR 44, setting a connection between the resistor lead 54 and the master ODTR 44 to a high-impedance state except when the master ODTR in question is being calibrated. The calibration controllers 56 of the different I/O stripes 28, 30, 32, 34, 36, 38 are connected to each other in a ring by signal lines 58 (see FIG. 1). In operation, each calibration controller 56 is programmed to calibrate its master ODTR 44 when a signal is received on the ring signal line 58 from the previous calibration controller in the ring. In an embodiment, the signal is that the ring signal line 58 goes logic high. Each calibration controller 56 is programmed to send the signal on the ring signal line 58 to the next calibration controller 56 upon completing the calibration process. Where the signal is that the ring signal line 58 goes high, the lines may be returned to the low state at a convenient time, because the low-going edge has no operational significance. Thus, while one master ODTR 44 is being calibrated, the other calibration controllers 56 do not attempt to calibrate their respective master ODTRs, avoiding the imprecisions that could arise if more than one calibration controller was drawing current through the standard resistor 52 at the same time. However, each calibration controller 56 in turn automatically follows the previous controller in calibrating the associated master ODTR 44.

One calibration controller 56 is programmed to calibrate its master ODTR 44 when the device 20 is powered up or otherwise initialized. The other calibration controllers 56 are programmed to set their resistor leads 54 to high impedance when the device 20 is powered up or otherwise initialized, and not to calibrate their master ODTR 44 until they receive a high-going edge on the ring signal line 58.

Figure 3:
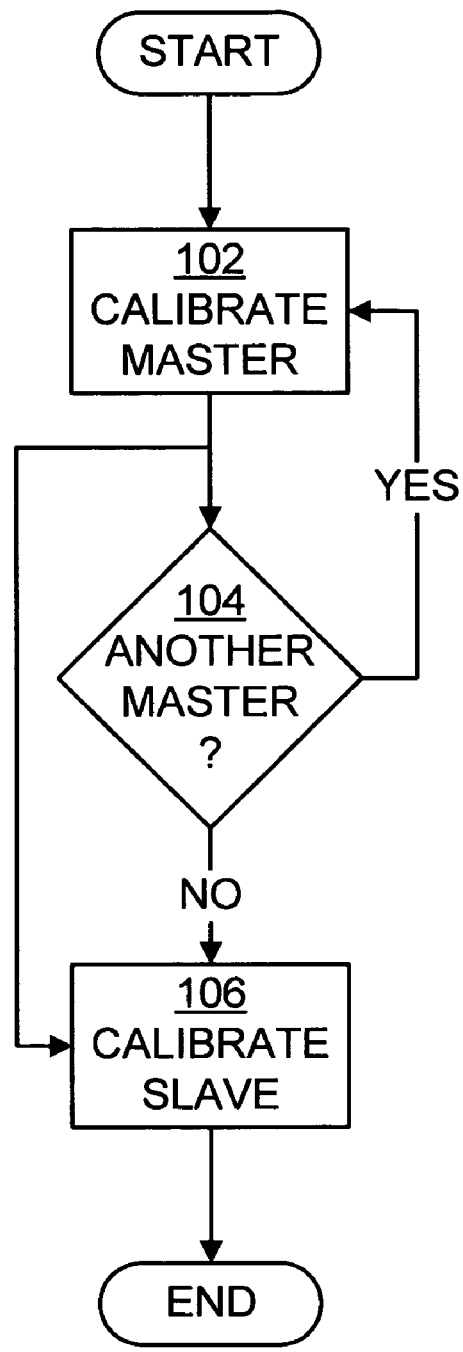
FIG. 3 is a flowchart of a first embodiment of a process in accordance with an embodiment of the invention.

Referring now to FIG. 3, in one embodiment of a process for operating a device having a plurality of input/output lines with termination impedances, in step 102, a master ODTR 44 is calibrated by comparing the master ODTR with the standard resistor 52. In step 104, it is determined whether more master ODTRs 44 remain to be calibrated. If so, the process returns to step 102 to calibrate the next master ODTR 44. Once one of the master ODTRs 44 has been calibrated, in step 106 the process copies the setting of the calibrated master ODTR 44 to calibrate the associated slave ODTRs 46 in the same I/O stripe 28, 30, 32, 34, 36, 38. If it is determined in step 104 that no more master ODTRs 44 remain to be calibrated, the process proceeds to step 106 to calibrate the slave ODTRs 46 associated with all the master ODTRs, and then ends.

Figure 4:
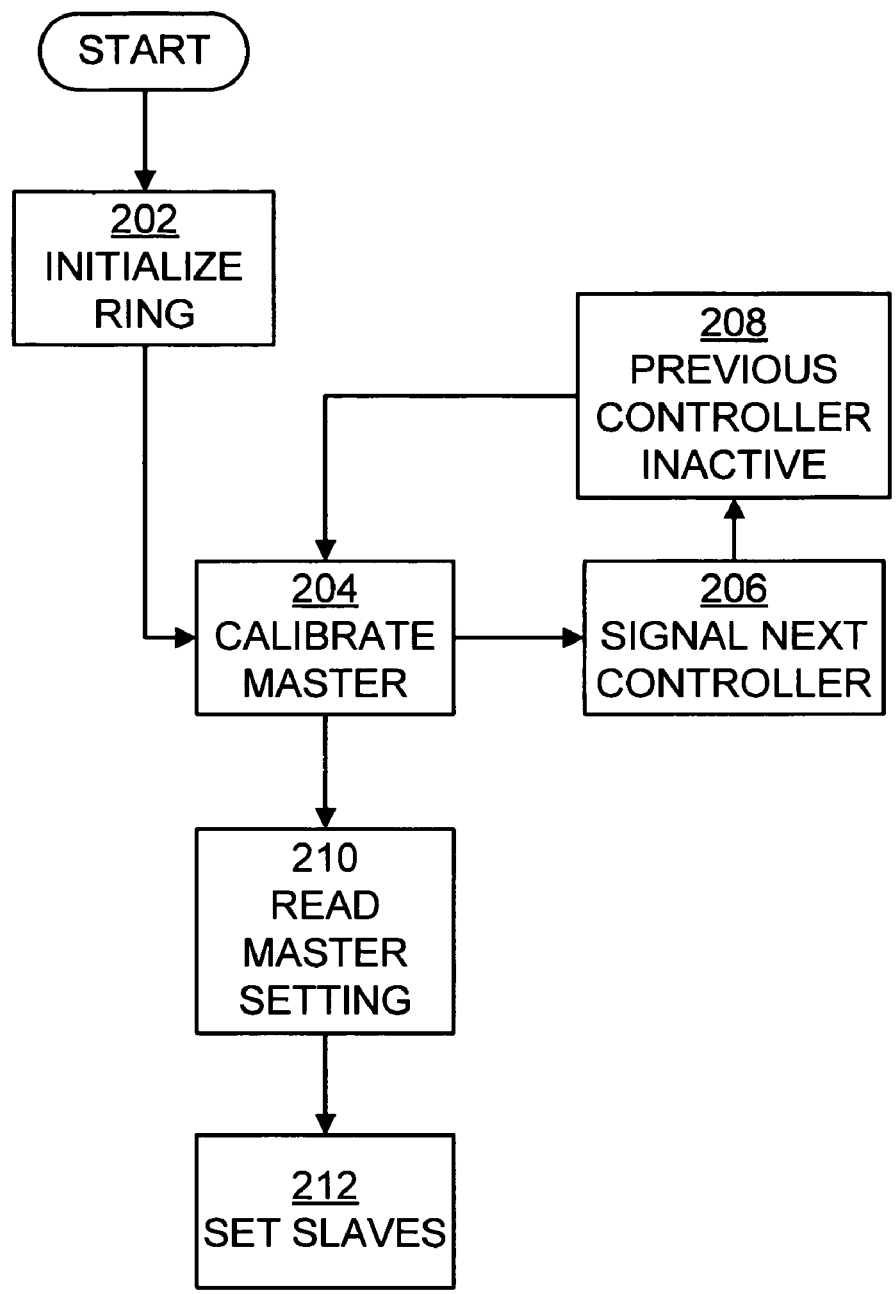
FIG. 4 is a flowchart of a further embodiment of a process in accordance with a further embodiment of the invention.

Referring now to FIG. 4, in another embodiment of a process for operating a device having a plurality of input/output lines with termination impedances, in step 202, a ring of calibration controllers 56 is initialized, so that a first calibration controller 56 connects to the standard resistor 52 to calibrate its associated master ODTR 44. All of the other calibration controllers are set to an inactive state, with their resistor leads 54 at high impedance.

In step 204, the first calibration controller 56 calibrates its associated master ODTR 44. As shown in FIG. 2, the master ODTR 44 is not used to terminate a signal lead 42, so the calibration does not affect the use of the I/O stripe. In step 206, the first calibration controller signals to the next calibration controller in the ring over the ring signal line 58, and in step 208 the first calibration controller goes inactive. The process then returns to step 204 where the next calibration controller 56 calibrates its master ODTR 44.

Once the master ODTR 44 is calibrated in step 204, the process branches to step 210, where the setting of the newly calibrated master ODTR 44 is read, and the setting is broadcast to the associated slave ODTRs 46. In step 212, the slave ODTRs are then set to the same setting as the master ODTR. A change in the calibration of a slave ODTR 46 may involve switching a FET on or off, increasing or decreasing the number of resistors in the circuit and causing a small change in the equivalent resistance. Such a change can be effected without interrupting the signal flow through the signal leads 42. Steps 210 and 212 take place independently of the loop through steps 206 and 208 back to 204, and the loop does not wait for or depend on steps 210 and 212. Steps 210 and 212 are therefore symbolically shown as a side branch that does not return to the loop.

The process then proceeds, cycling through steps 204, 206, 208, with each calibration controller 56 in turn calibrating its master ODTR 44. Because the calibration controllers 56 are connected in a ring, there is no end to the loop, unless and until the device 20 is shut down or reinitialized. Each master ODTR 44 is recalibrated against the standard resistor 52 repeatedly, at a loop time interval determined by the length of time taken to calibrate all of the master ODTRs 44 on the device 20. Each slave ODTR 46 is reset to match its associated master ODTR 44 at the same loop time interval, every time the master ODTR 44 is recalibrated. Provided this loop time interval is small compared with a likely rate of change of the values of the resistors (not shown) of the ODTRs 44, 46, the ODTRs 44 and 46 are kept correctly set as long as the device 20 is operating.

Various modifications and variations can be made in the present invention without departing from the spirit or scope of the invention. For example, in the embodiments the standard resistor 52, the master ODTRs 44, and the slave ODTRs 46 all have the same resistance when correctly calibrated. The impedances may not all be the same, for example, if signal lines 40 of different types are used. Appropriate arithmetic may then be used to generate the desired resistance values from the resistance of the standard resistor 52.

For example, each stripe 28, 30, 32, 34, 36, 38 is shown as a single logical I/O port, and as a group of one master ODTR 44 and the slave ODTRs 46 associated with that master ODTR. Alternatively, two or more logical I/O ports could be grouped with a single master ODTR 44, or a wide I/O port could be divided into groups of leads with separate master ODTRs 44.

In FIGS. 1 and 2, a ring of dedicated lines 58 with each calibration controller 56 signaling the next calibration controller directly is used to coordinate sharing of the single reference resistor 52 between the calibration controllers. Other signaling arrangements may be used for coordinating the group of calibration controllers 56 that share a reference resistor 52. A device 20 may have more than one group of calibration controllers 56, with each group sharing a reference resistor 52.

In the interests of clarity, the signal leads 42, 54, 58 have been shown symbolically in the drawings as single lines. In an embodiment, some or all of the signal leads may be pairs of leads. In an embodiment, some or all of the signal leads may be single leads cooperating with a common reference. For example, a ground or power supply voltage that is supplied throughout the die 22 may be used as a common reference for the ring signal lines 58.

FIG. 3 shows a process in which each ODTR 44, 46 is calibrated once. FIG. 4 shows a process in which each ODTR 44, 46 is calibrated repeatedly, at a frequency determined by the time taken to calibrate all of the master ODTRs. Depending on how fast the resistance of the ODTRs 44, 46 drifts in use, the calibration may be repeated at some other frequency, for example, by repeating the process of FIG. 3 at a desired frequency or by including a delay in the loop in FIG. 4.

Thus, it is intended that the present invention cover the modifications and variations of this invention provided they come within the scope of the appended claims and their equivalents.

What is claimed is:

1. A device comprising:
    a plurality of leads with termination impedances;
    a standard impedance;
    said termination impedances comprising a plurality of master impedances each arranged to be individually calibrated by comparison with said standard impedance;
    said termination impedances comprising slave impedances arranged to be calibrated in accordance with an associated one of said master impedances; and
    a plurality of calibration controllers associated with said master impedances, said calibration controllers cooperating with one another such that only one said master impedance at a time is being compared with said standard impedance;
    wherein said calibration controllers are connected in a ring, and wherein each calibration controller in said ring is arranged to signal a next calibration controller in said ring after comparing said associated master impedance with said standard impedance, and to start comparing said associated master impedance with said standard impedance only after being signaled by a previous calibration controller in said ring.

2. A device according to claim 1, wherein said termination impedances are arranged in a plurality of groups, each said group comprising one of said master impedances and the associated said slave impedances.

3. A device according to claim 2, wherein said termination impedances are so arranged that, in normal use of said device, environmental influences affecting the values of said termination impedances vary more between different groups within said plurality of groups than within a single group within said plurality of groups.

4. A method of operating a device having a plurality of lines with termination impedances, comprising:
   individually calibrating each of a plurality of master termination impedances by successively comparing said master termination impedances with a standard impedance;
   calibrating slave termination impedances in accordance with an associated master termination impedance;
   repeatedly calibrating said master termination impedances in a cyclical order; and
   connecting said master termination impedances in a ring, and passing signals from each said master termination impedance in said ring to a next said master termination impedance in said ring to indicate when to calibrate said next master termination impedance.

5. A method according to claim 4, further comprising repeatedly calibrating said slave termination impedances after calibrating the associated master termination impedance.

6. A method according to claim 4, further comprising associating each of said slave termination impedances with a nearest one of said plurality of master termination impedances.

* * * * *